(12) United States Patent
Niu et al.

(10) Patent No.: US 6,855,464 B2
(45) Date of Patent: Feb. 15, 2005

(54) GRATING TEST PATTERNS AND METHODS FOR OVERLAY METROLOGY

(75) Inventors: Xinhui Niu, Los Altos, CA (US); Nickhil Jakatdar, Los Altos, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/739,660

(22) Filed: Dec. 17, 2003

(65) Prior Publication Data

US 2004/0137341 A1 Jul. 15, 2004

Related U.S. Application Data

(63) Continuation of application No. 09/794,686, filed on Feb. 27, 2001, now Pat. No. 6,699,624.

(51) Int. Cl.[7] .............................. G03F 9/00; G03C 5/00
(52) U.S. Cl. ............................................ 430/5; 430/394
(58) Field of Search ............................ 430/5, 311, 394; 356/400, 401

(56) References Cited

U.S. PATENT DOCUMENTS

| | | | |
|---|---|---|---|
| 4,332,473 A | 6/1982 | Ono | 356/509 |
| 4,422,763 A * | 12/1983 | Kleinknecht | 356/509 |
| 4,929,083 A | 5/1990 | Brunner | 356/400 |
| 5,347,356 A | 9/1994 | Ota et al. | 356/490 |
| 5,545,593 A | 8/1996 | Watkins et al. | 438/16 |
| 5,672,520 A | 9/1997 | Natsume | 356/401 |
| 6,079,256 A | 6/2000 | Bareket | 73/105 |
| 6,498,640 B1 * | 12/2002 | Ziger | 355/53 |

FOREIGN PATENT DOCUMENTS

| EP | 0 281 030 A2 | 9/1988 |
|---|---|---|
| EP | 0 422 395 A2 | 4/1991 |

OTHER PUBLICATIONS

Neal T. Sullivan, Semiconductor Pattern Overlay, 15 pages, Digital Equipment Corp., Advanced Semiconductor Development, Hudson, MA 01749–2895.

* cited by examiner

Primary Examiner—S. Rosasco
(74) Attorney, Agent, or Firm—Morrison & Foerster LLP

(57) ABSTRACT

Overlay measurements are obtained by forming a first grating test pattern using a first layer mask. A second grating test pattern is formed using a second layer mask. The first and second grating test patterns have the same periodicity. The first and second grating test patterns are measured using an optical metrology equipment. The alignment of the second layer mask to the first layer mask is measured based on the measurement of the first and second grating test patterns.

31 Claims, 13 Drawing Sheets

Line - on - Line nth Layer Mask
20 after lithography development
21 after etch
22

(n+1)th Layer Mask
23 after lithography development
24

Line - in - Line nth Layer Mask

40 after lithography development
41 after etch
42

(n+1)th Layer Mask

43 after lithography development
44

GRATING TEST PATTERNS AND METHODS FOR OVERLAY METROLOGY

CROSS REFERENCE TO RELATED APPLICATIONS

This application is a continuation of U.S. patent application Ser. No. 09/794,686, filed on Feb. 27, 2001 now U.S. Pat. No. 6,699,624, titled GRATING TEST PATTERNS AND METHODS FOR OVERLAY METROLOGY, which is incorporated herein by reference in its entirety.

BACKGROUND

1. Field of the Invention

The present invention relates generally to precision optical measurement of the two process layers on a semiconductor wafer, and more particularly to a set of diffraction grating test patterns that are used in combination with rigorous diffraction grating analysis.

2. Description of Related Art

Lithography continues to be the key enabler and driver for the semiconductor industry. Metrology equipment and method for critical dimension (CD) and overlay control are the key elements of the lithography infrastructure. Overlay and CD control over large field sizes will continue to be a major concern for sub-100 nm lithography. Overlay requirements are among the most difficult technical challenges in lithography.

The main contributing factors to overlay error are the stage, the alignment system and the distortion signature. Errors can be broken down into stage motion or wafer alignment errors such as placement and rotation inaccuracies and field errors such as errors on the reticle and errors in camera magnification. These errors are correctable. Pincushion or barrel distortions, third-order field errors, are not correctable. The overlay errors must be routinely characterized for a given exposure tool. Three fundamental components of overlay are the alignment target detection capability, the stage positioning accuracy and precision, and the difference in lens distortion between two tools used to expose overlaying process layers.

Technologies used for overlay measurement include electrical test, scanning electron microscope (SEM), and optical microscope. Coherence probe microscopy (CPM), by adding an interferometer to the microscope, enables phase-based measurements that can pick up subtle differences in the index of refraction and the topography. Optical microscope technology has been the dominant measurement technique.

Overlay targets often are variations of box-in-a-box. The center of each box is calculated independently, and a difference between them is determined. Some metrology tools measure overlay error as a combination of linewidth measurements. To increase contrast, the boxes can be replaced with combinations of bars and frames, which add structure at the target's perimeter by providing two edges instead of one. A shortcoming is that there is no practical standard for overlay. Therefore, a true value for any particular overlay target is not known. Some fabs may periodically look at cross sections or make comparisons to electrical parameters, however, not only is this time consuming, it is relegated to the characterization environment, rather than being accomplished in production.

Alignment target detection became a show-stopper for many exposure tools with the proliferation of CMP levels, where very planarized metal layers present considerable challenges to finding and measuring a target's position.

One conventional solution uses a box-in-box test pattern. The details of this conventional solution is described in a section, for example, entitled "Semiconductor Pattern Overlay" in the Handbook of Critical Dimensions Metrology and Process Control, SPIE, vol. CR52, 1994, pp. 160–188.

The shortcomings of conventional solutions include, asymmetry of patterned line profile, aberrations in the illumination and imaging optics, and individual test pattern image sampling. One further shortcoming is that, for polished layers, the signal-to-noise (S/N) ratio in prior arts can be poor and affected by contrast variations in film thickness.

Accordingly, it is desirable to have a fast and flexible method and system for grating overlay patterns.

SUMMARY

In one exemplary embodiment, overlay measurements are obtained by forming a first grating test pattern using a first layer mask. A second grating test pattern is formed using a second layer mask. The first and second grating test patterns have the same periodicity. The first and second grating test patterns are measured using an optical metrology equipment. The alignment of the second layer mask to the first layer mask is measured based on the measurement of the first and second grating test patterns.

DETAILED DESCRIPTION OF THE PREFERRED EMBODIMENT(S)

Figure 1:
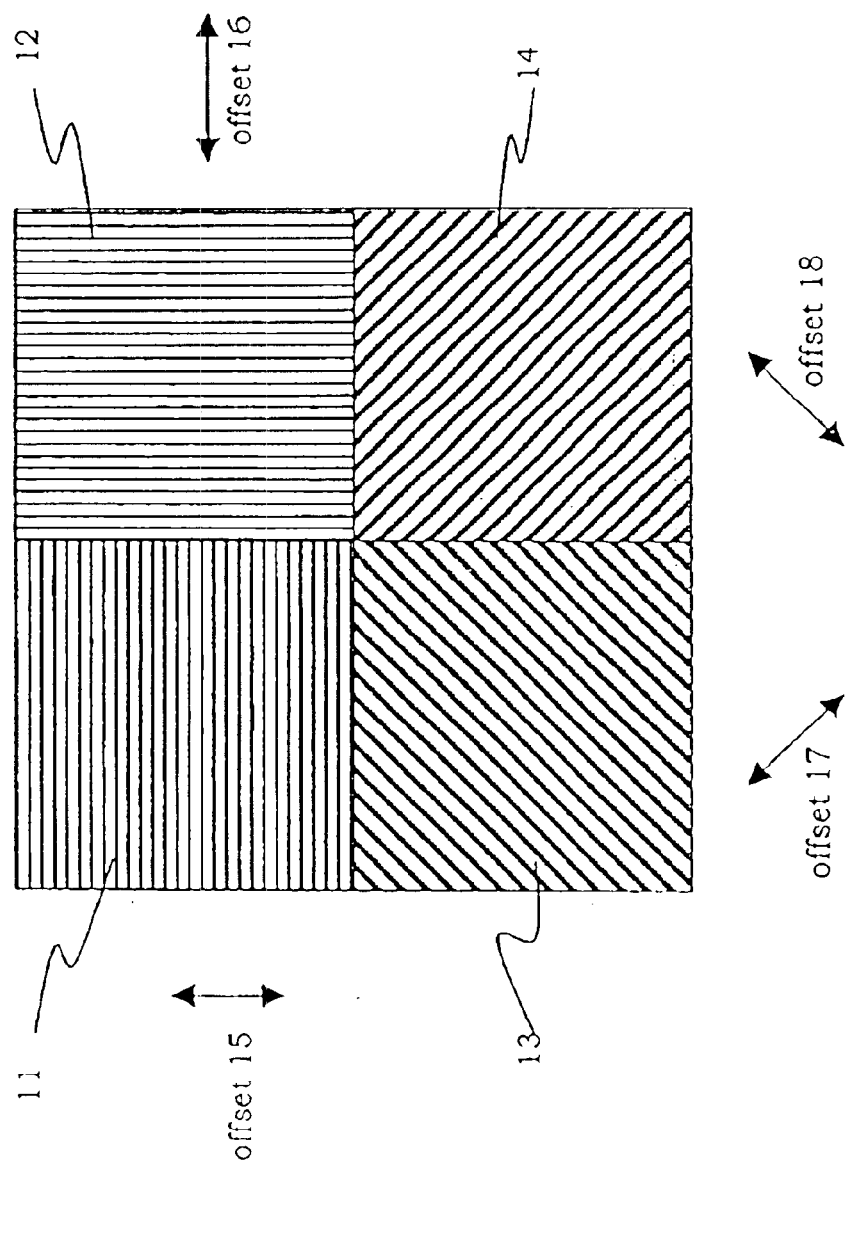
FIG. 1 is a pictorial diagram illustrating quad orientations of overlay patterned grating lines in accordance with the present invention.

FIG. 1 is a pictorial diagram illustrating the quad orientation of overlay patterned gratings 10, with a grating A 11, a grating B 12, a grating C 13, and a grating D 14. The orientation of the patterned grating lines in the present invention is placed at 0, 90, −45, and 45 degrees. The grating A 11 is orthogonal to the grating B 12, and the grating C 13 is orthogonal to the grating D 14.

In the grating A 11, the overlay test pattern lines extend horizontally, with the desirable offset that is detected in an arrow direction 15. In the grating B 12, the overlay test pattern lines extend vertically, with the desirable offset that is detected in an arrow direction 16. In the grating C 13, the overlay test pattern lines extend diagonally with a positive slope, with the desirable offset that is detected in an arrow direction 17. In the grating D 14, the overlay test pattern lines extend diagonally with a negative slope, with the desirable offset that is detected in an arrow direction 18. An orthogonal pair can provide overlay information in any orientation. Furthermore, an orthogonal pair can avoid loading/unloading of a wafer for different overlay orientation requirements.

A mask is a pattern tool, which contains patterns that can be transferred to an entire wafer in one exposure. A mask is said to be a dark-field (or negative) tool, if the field (or background) areas are opaque, and to be a clear-field (or positive) tool if the field is transparent.

Figure 2A:
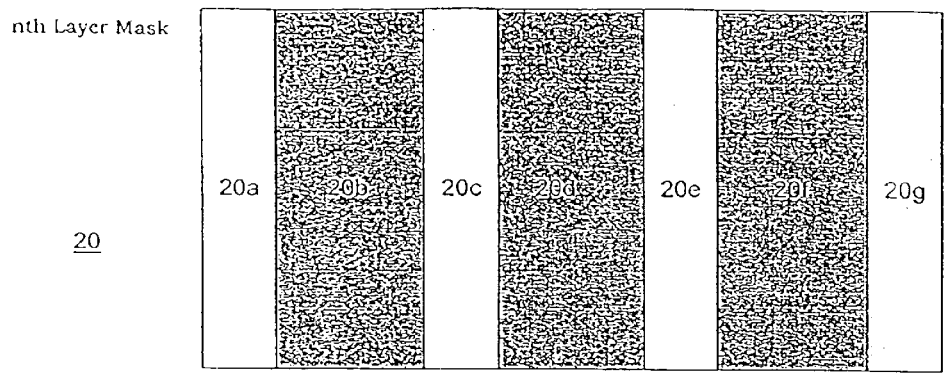
FIGS. 2A–2E are process diagrams illustrating a line-on-line overlay patterned grating in accordance with the present invention.
Figure 2B:
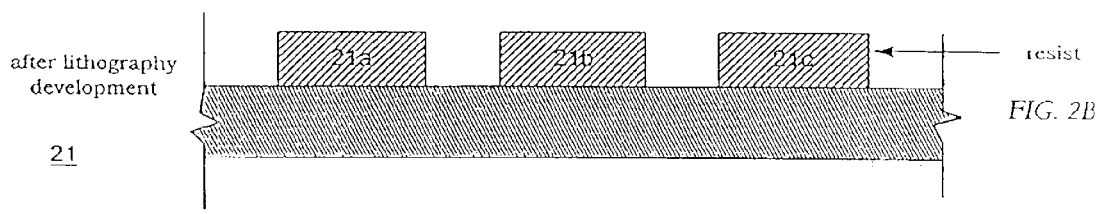
Figure 2C:
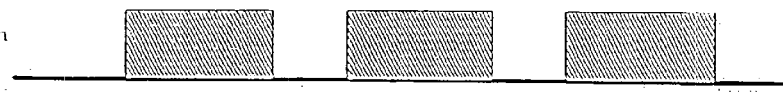
Figure 2D:
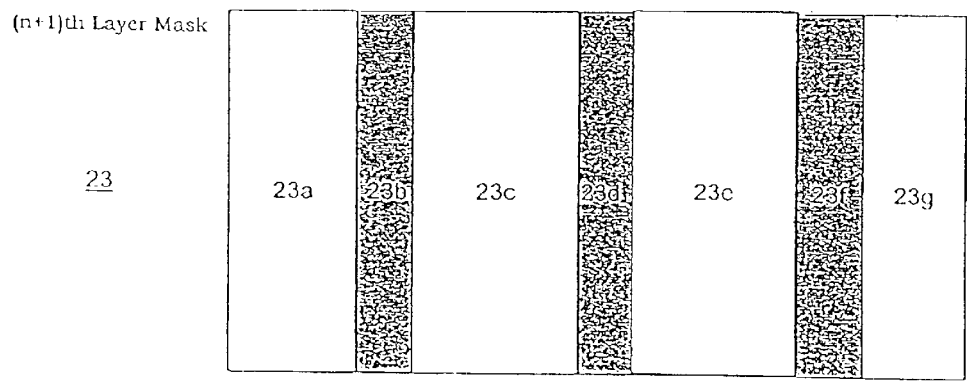
Figure 2E:
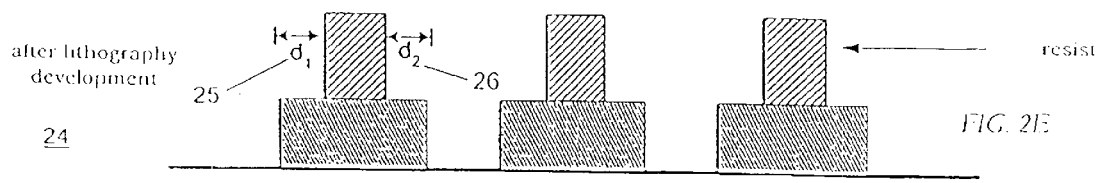

FIGS. 2A–2E are process diagrams illustrating a line-on-line overlay test structure. Here we use positive masks for the illustration. FIG. 2A shows a first layer mask 20, with clear lines 20a, 20c, 20e, and 20g, and dark lines 20b, 20d, and 20f. The dark lines 20b, 20d, and 20f are wider than the clear lines 20a, 20c, 20e, and 20g. FIG. 2B shows how the photoresist is patterned after the lithography development 21. Photoresist 21a, 21b, and 21c are patterned over the first layer mask 20. FIG. 2C shows how the material under the photoresist is patterned after the etch process 22 (note that photoresist is removed). FIG. 2D shows the second layer mask 23, with clear lines 23a, 23c, 23e, and 23g, and dark lines 23b, 23d, and 23f. The clear lines 23a, 23c, 23e, and 23g are wider than the dark lines 23b, 23d, and 23f. FIG. 2E shows how the photoresist is patterned on the previous patterned layer 24. A $d_1$ 25 distance measures a gap from the left edge of the first dark line in the second mask to the left edge of the first dark line in the first mask; and a $d_2$ 26 distance measures a gap from the right edge of the first dark line in the second mask to the right edge of the first dark line in the first mask.

Figure 3A:
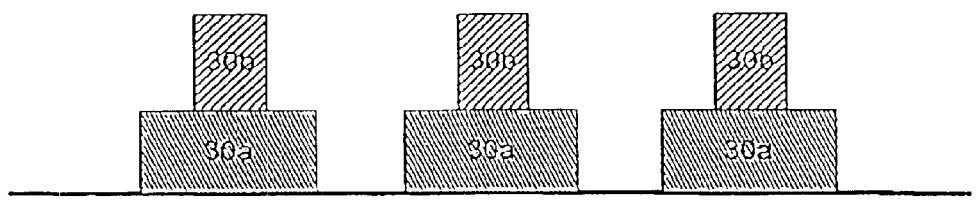
FIGS. 3A–3D are process diagrams illustrating various examples of adding one or more layers in a line-on-line overlay patterned grating in accordance with the present invention.
Figure 3B:
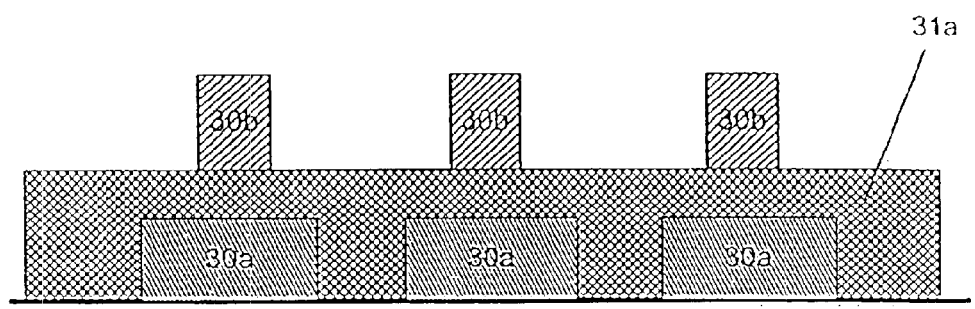
Figure 3C:
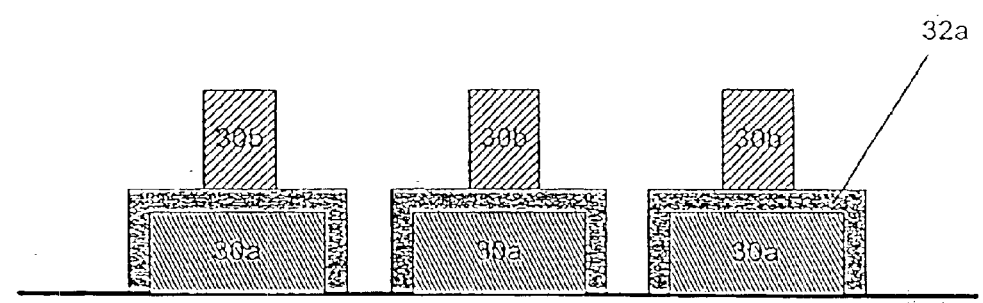
Figure 3D:
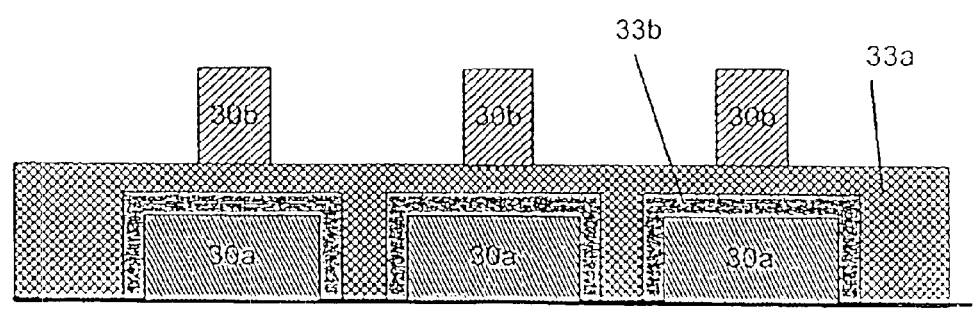

There can be some material layers between the second lithography process and the first etch process. For example, FIGS. 3A–3D are process diagrams of various examples of adding one or more layers in a line-on-line overlay patterned grating. FIG. 3A shows a general structural diagram 30 with a first etch process 30a and a second lithography process 30b. In a first type of structural diagram 31 in FIG. 3B, a material layer 31a is inserted between the first etch process 30a and the second lithography process 30b. In a second type of structural diagram 32 in FIG. 3C, a material layer 32a is placed between the first etch process 30a and the second lithography process 30b. In a third type of structural diagram 33 in FIG. 3D, two material layers 33a and 33b are placed between the first etch process 30a and the second lithography process 30b.

Figure 4A:
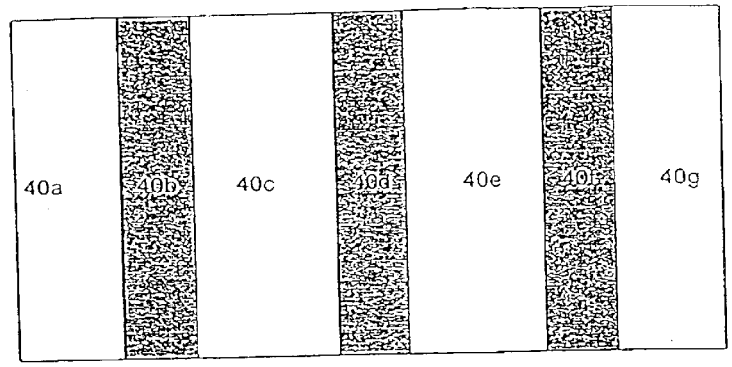
FIGS. 4A–4E are process diagrams illustrating a line-in-line overlay patterned grating in accordance with the present invention.
Figure 4B:
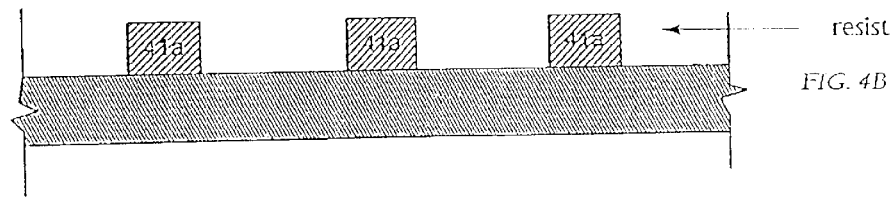
Figure 4C:
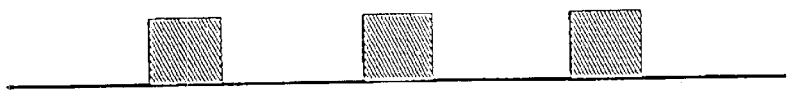
Figure 4D:
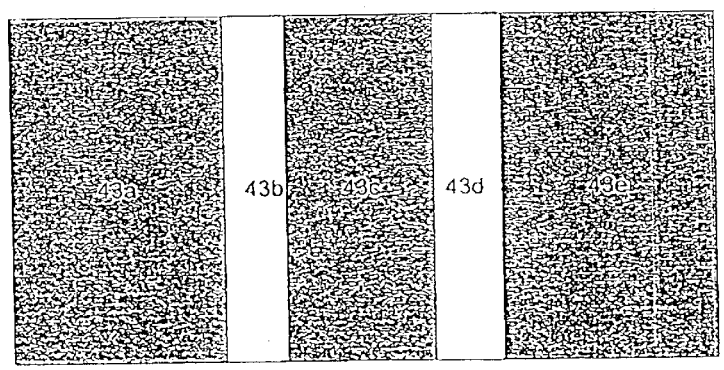
Figure 4E:
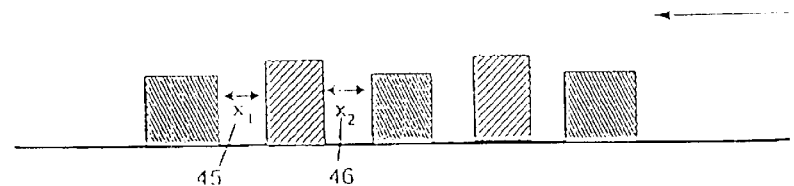

FIGS. 4A–4E are process diagrams illustrating a line-in-line overlay test structure. Here we use positive masks for the illustration. FIG. 4A shows a first layer mask 40, with clear lines 40a, 40c, 40e, and 40g, and dark lines 40b, 40d, and 40f. The dark lines 40b, 40d, and 40f are narrower than the clear lines 40a, 40c, 40e, and 40g. FIG. 4B shows how the photoresist is patterned after the lithography development 41. Photoresist 41a is patterned over the first layer mask 40. FIG. 4C shows how the material under photoresist is patterned after the etch process 42 (note that photoresist is removed). FIG. 4D shows the second layer mask 43, with dark lines 43a, 43c, and 43e, and clear lines 43b and 43d. The dark lines 43a, 43c, and 43e are wider than the clear lines 43b and 43d. FIG. 4E shows how the photoresist is patterned on the previous patterned layer 44. An $X_1$ 45 distance measures a gap from the left edge of the first clear line 43b in the second mask to the left edge of the second clear line 40c in the first mask, and an $X_2$ 46 distance measures a gap from the right edge of the first clear line 43b in the second mask to the right edge of the second clear line 40c in the first mask.

Figure 5A:
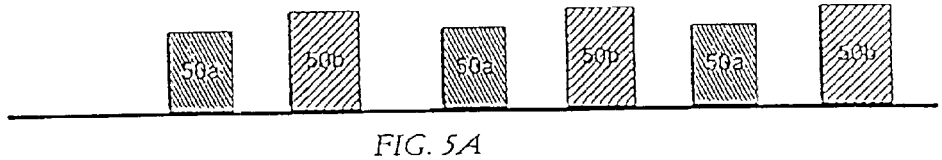
FIGS. 5A–5D are process diagrams illustrating various examples of adding one or more layers in a line-in-line overlay patterned grating in accordance with the present invention.
Figure 5B:
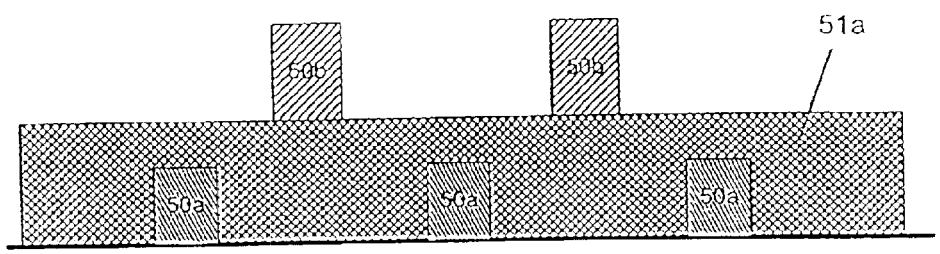
Figure 5C:
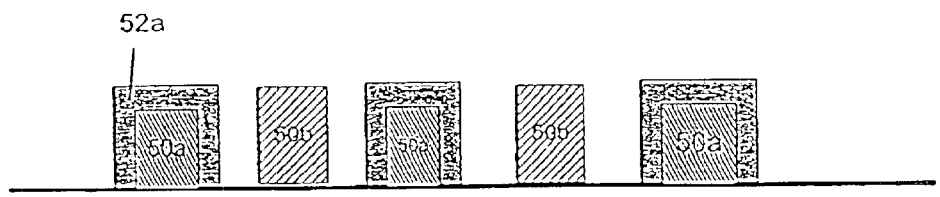
Figure 5D:
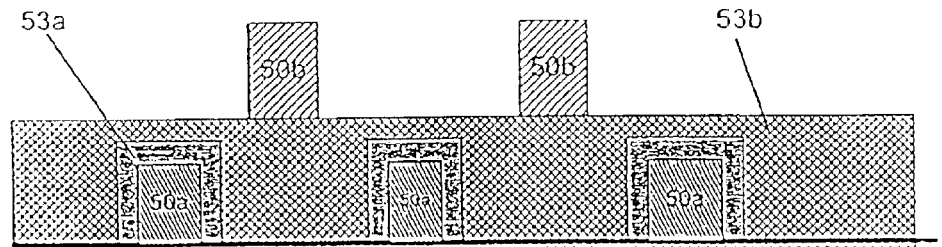

There can be some material layers between the second lithography process and the first etch process. For example, FIGS. 5A–5D are process diagrams of various examples of adding one or more layers in a line-in-line overlay patterned grating. FIG. 5A shows a general structural diagram 50 with a first etch process 50a and a second lithography process 50b. In a first type of structural diagram 51 in FIG. 5B, a material layer 51a is inserted between the first etch process 50a and the second lithography process 50b. In a second type of structural diagram 52 in FIG. 5C, a material layer 52a is placed between the first etch process 50a and the second lithography process 50b. In a third type of structural diagram 53 in FIG. 5D, two material layers 53a and 53b are placed between the first etch process 50a and the second lithography process 50b.

The advantages provided by the orientation of patterned grating lines 10 are as follows. First, for spectroscopic reflectometry, there is no need to change the wafer. Overlay results obtained at different orientation angles can help to reduce random error. Secondly, for spectroscopic ellipsometry, the information from −45 and +45 degrees provides the complete minimum requirement for an overlay metrology purpose, without the requirement of reloading the wafer. Furthermore, the information from 0 or 90 degrees provides the most accurate overlay data.

At each orientation, the present invention has two test patterns, which are called "line-in-line" and "line-on-line" test patterns. The theoretical studies are shown in the following sections.

Complete 2- and 3-dimensional periodic profiles can be measured using phase and/or intensity information from optical techniques such as spectroscopic ellipsometry and reflectometry, as described in a co-pending patent application entitled "Optical Profilometry for 2-D and 3-D Sub-Micron Periodic Features With Three or More Material in the Periodic Layers," assigned to the same assignee, and accorded an application number of 60/474,051, which is incorporated herein by reference in its entirety.

Figure 6:
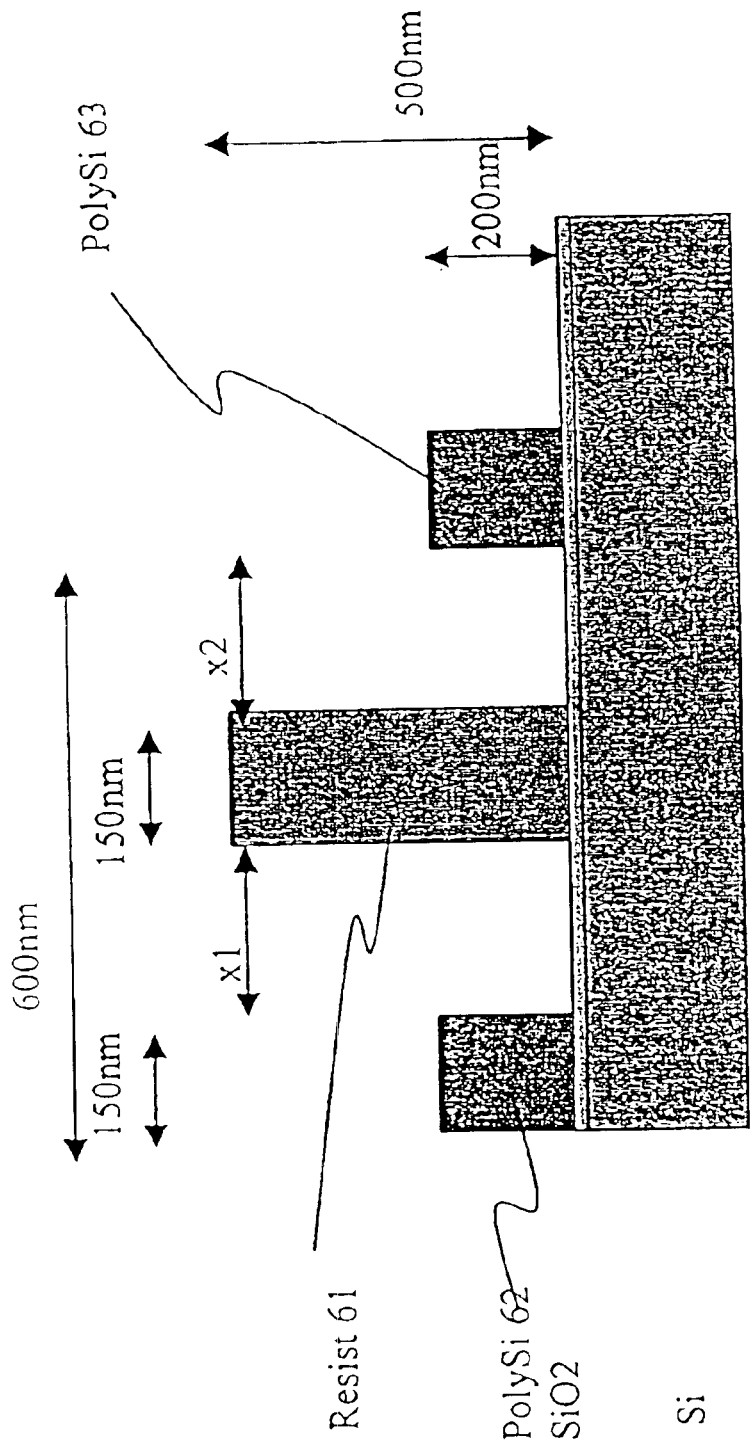
FIG. 6 is a process diagram illustrating a first example of a line-in-line structure in accordance with the present invention.
Figure 7B:
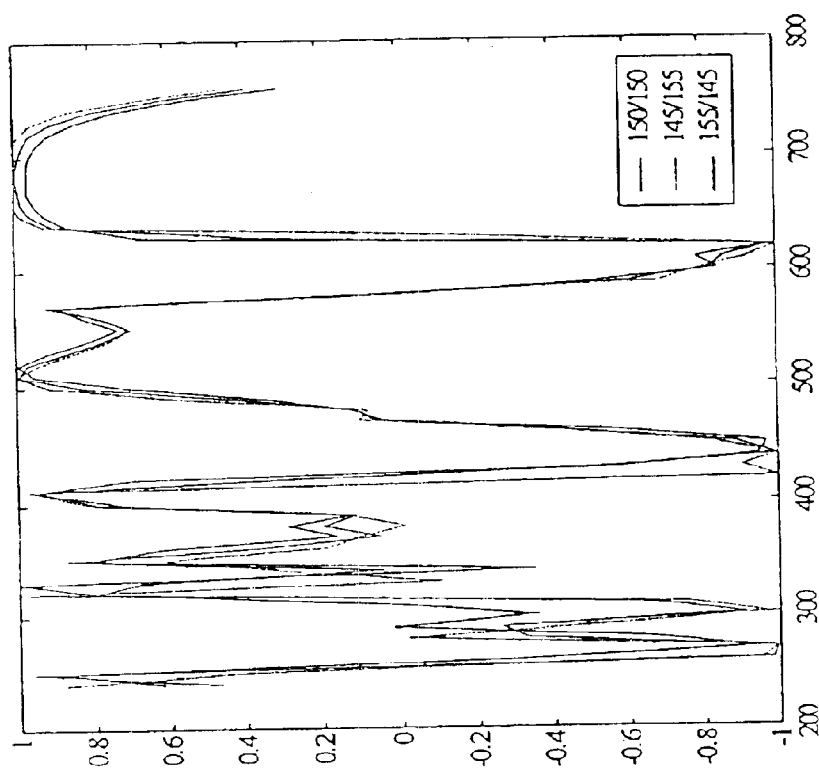
FIGS. 7A–7B are graphical diagrams illustrating the overlay measurement of the line-in-line structure in FIG. 6 using an ellipsometer in accordance with the present invention.
Figure 7A:
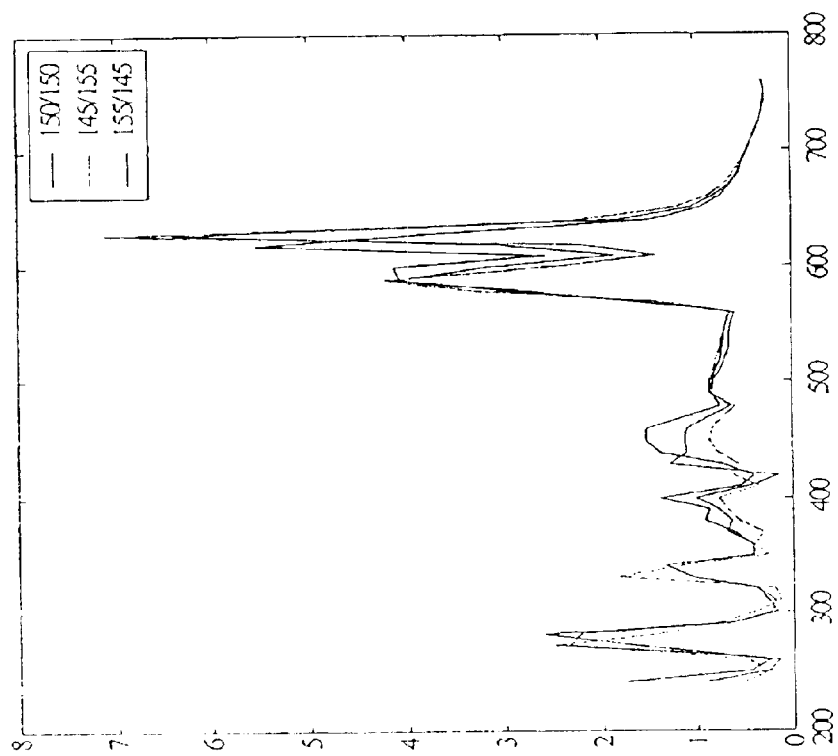

Simulations are performed to support the concepts described above. In all of the examples, it is shown that a 10 nm overlay error can be detected with the presented invention. FIG. 6 is a process diagram illustrating a first example of a line-in-line structure 60. A resist 61 is placed in between a PolySi 62 and a PolySi 63. The pitch is 600 nm from the left edge of the PolySi 62 to the left edge of the PolySi 63. If $x_1$=150, and $x_2$=150, then the resist 61 would be positioned in the center between the PolySi 62 and the PolySi 63. If the resist 61 moves 5 nm to the left, then $x_1$=145, and $X_2$=155. Or, if the resist 61 moves 5 nm to the right, then, then $x_1$=155, and $x_2$=145. FIGS. 7A–7B are graphical diagrams illustrating the overlay measurements of the line-in-line structure in FIG. 6 using an ellipsometer.

Figure 8:
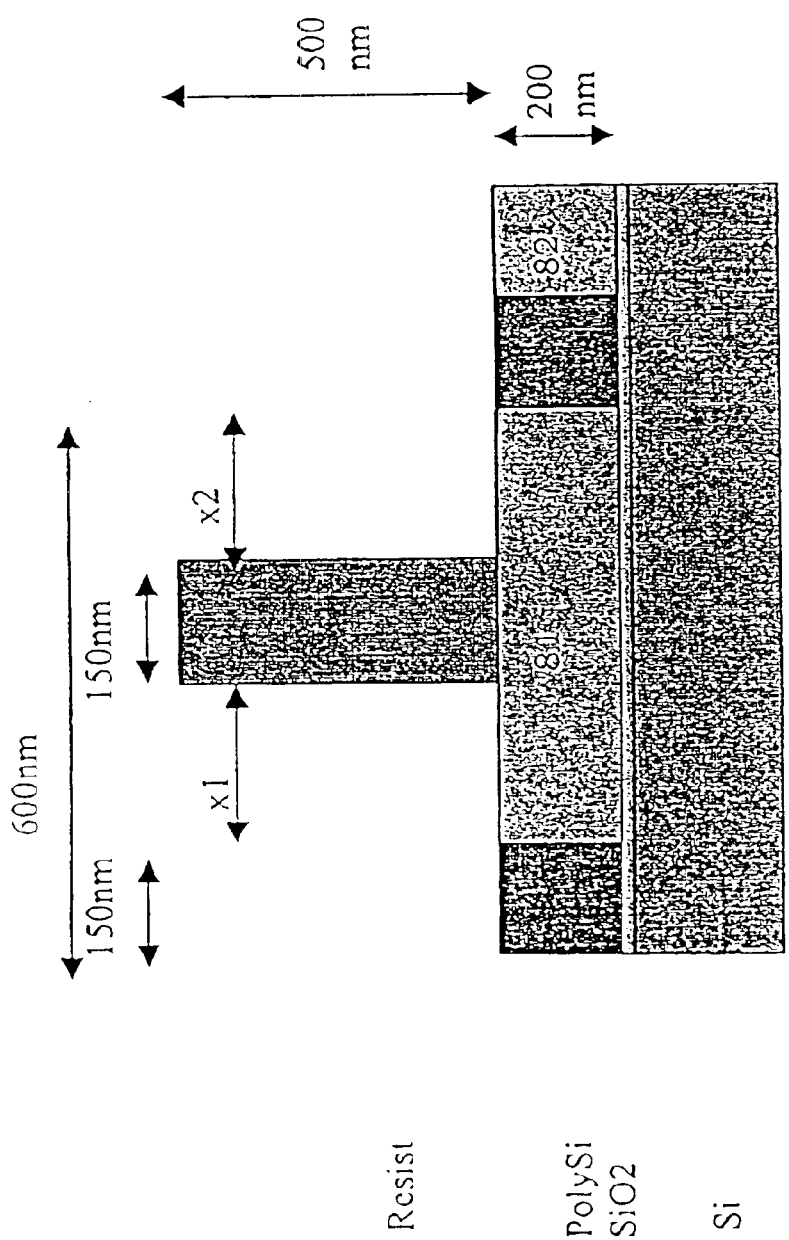
FIG. 8 is a process diagram illustrating a second example of a line-in-line structure in accordance with the present invention.
Figure 9A:
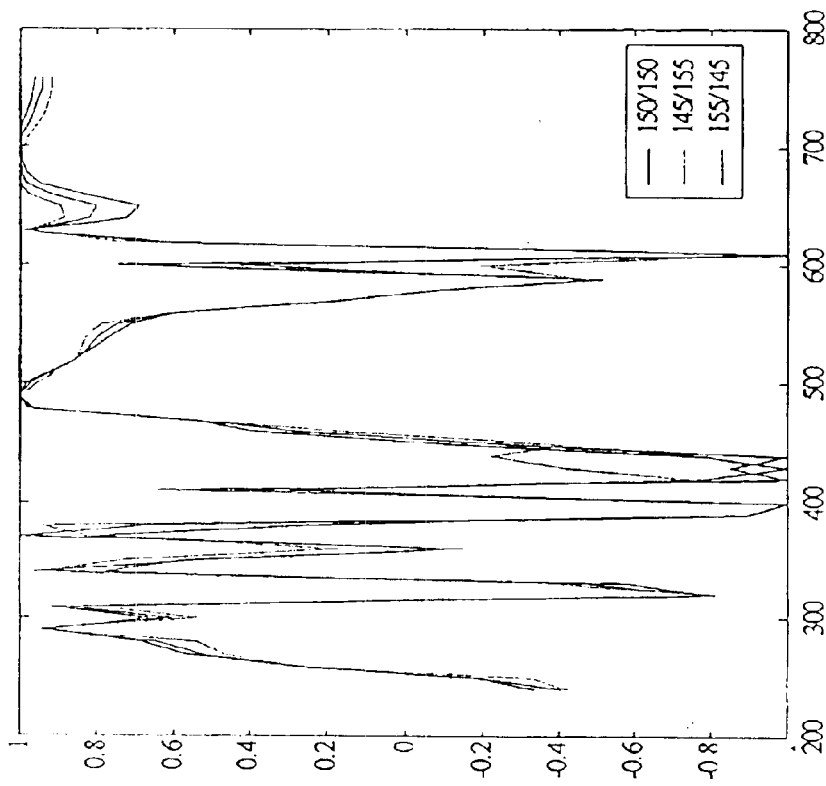
FIGS. 9A–9B are graphical diagrams illustrating the overlay measurement of the line-in-line structure in FIG. 8 using an ellipsometer in accordance with the present invention.
Figure 9B:
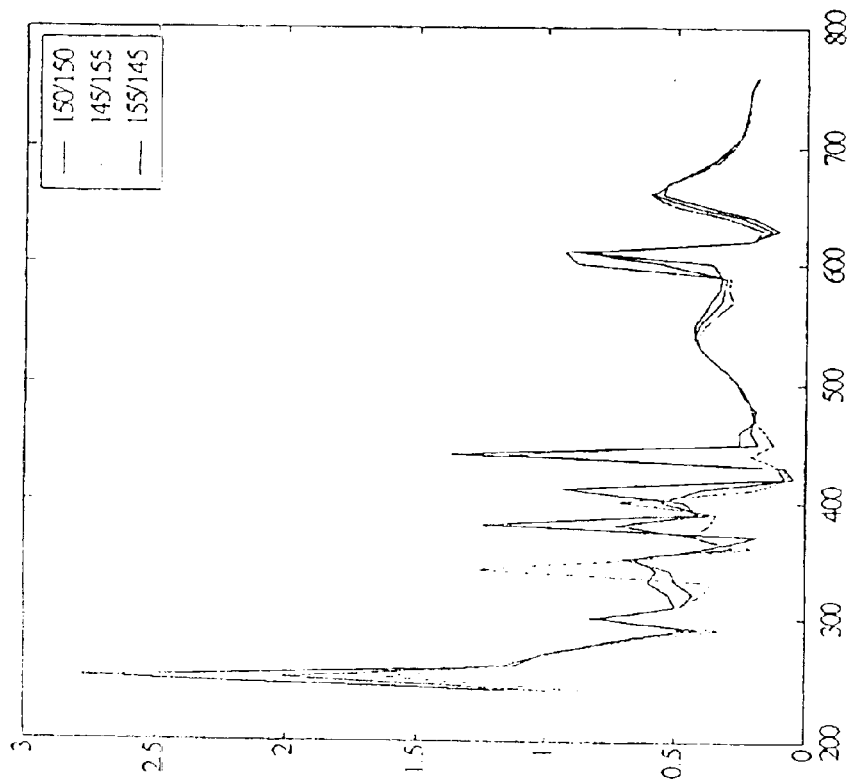

FIG. 8 is a process diagram illustrating a second example of a line-in-line structure 80. In this example, before placing the resist 61, dielectric layers 81 and 82 are deposited between the PolySi 62 and the PolySi 63, followed by CMP (chemical mechanical polishing) planarization. Although the edges for the PolySi 62 and the PolySi 63 are no longer detectable due to the fill-in of dielectric layers 81 and 82, the present invention can still detect the overlay since it does not depend on detection of edges. FIGS. 9A–9B are graphical diagrams illustrating the overlay measurements of the line-in-line structure in FIG. 8 using an ellipsometer.

Figure 10:
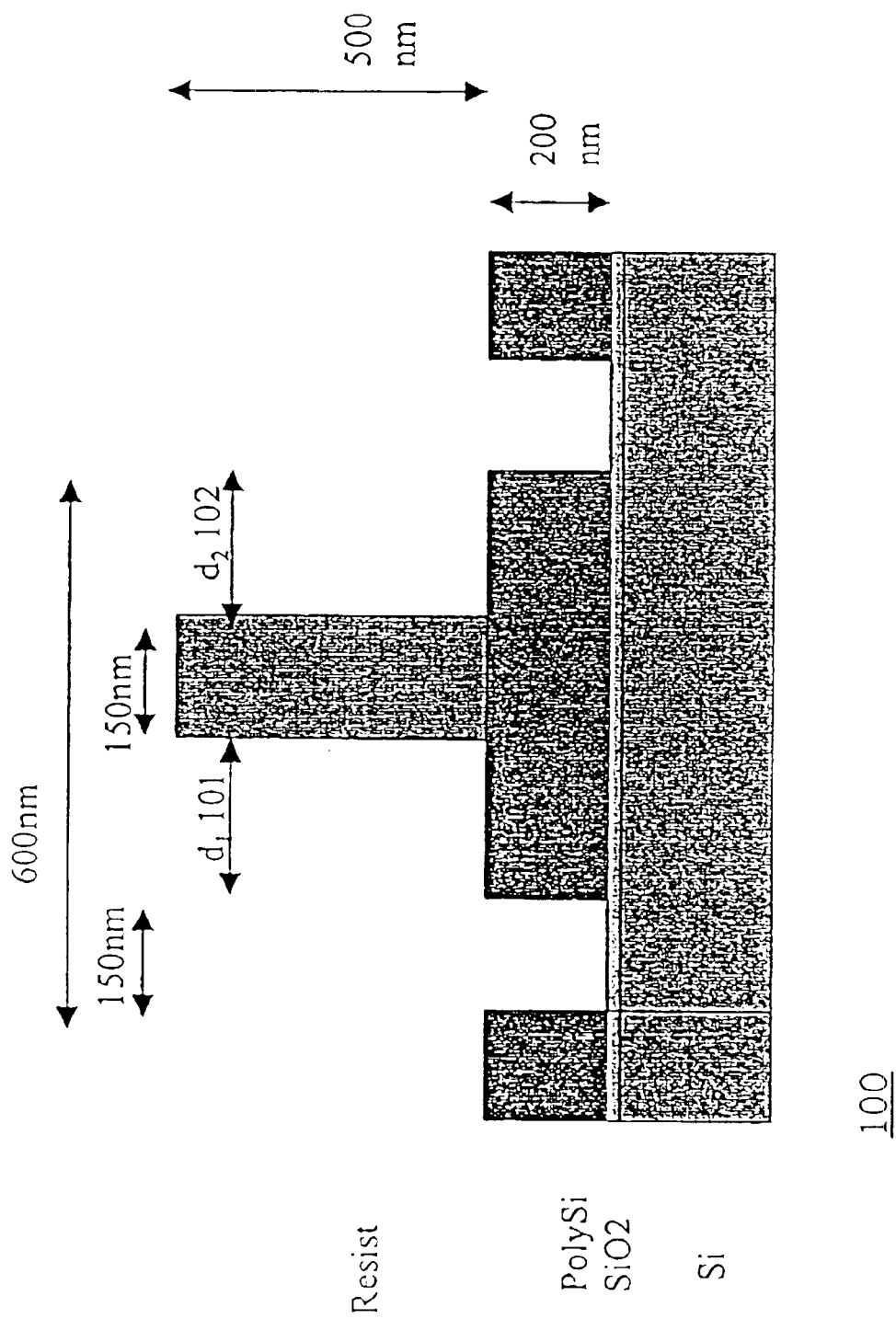
FIG. 10 is a process diagram illustrating a first example of a line-on-line structure in accordance with the present invention.
Figure 11B:
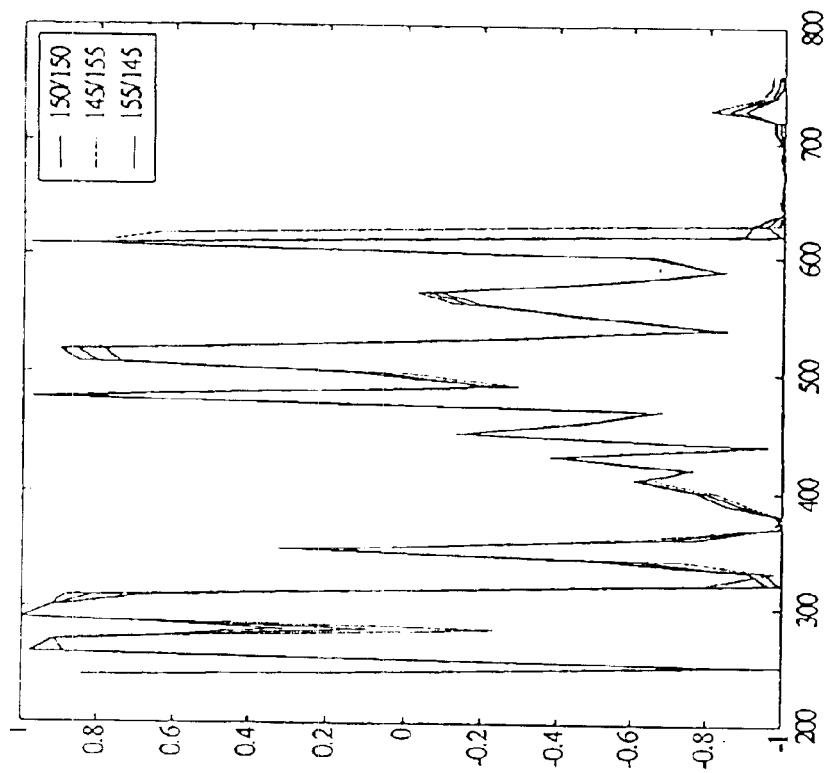
FIGS. 11A–11B are graphical diagrams illustrating the overlay measurements of the line-on-line structure in FIG. 10 using an ellipsometer in accordance with the present invention.
Figure 11A:
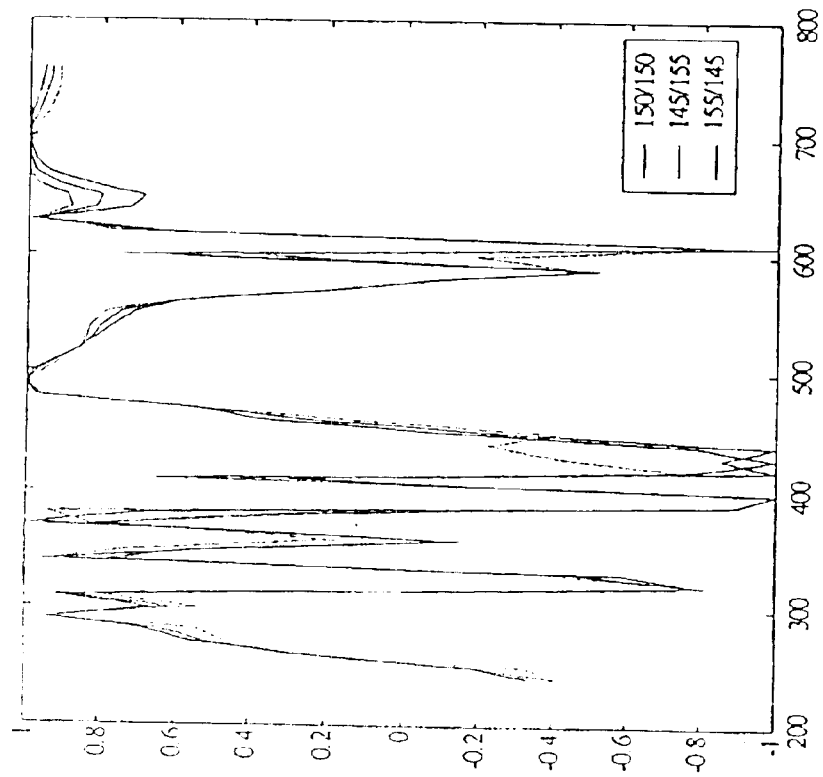

FIG. 10 is a process diagram illustrating a first example of a line-on-line structure 100 with distance $d_1$ 101 and $d_2$ 102. FIGS. 11A–11B are graphical diagrams illustrating the overlay measurements of the line-on-line structure in FIG. 10 using an ellipsometer in accordance with the present invention.

Figure 12:
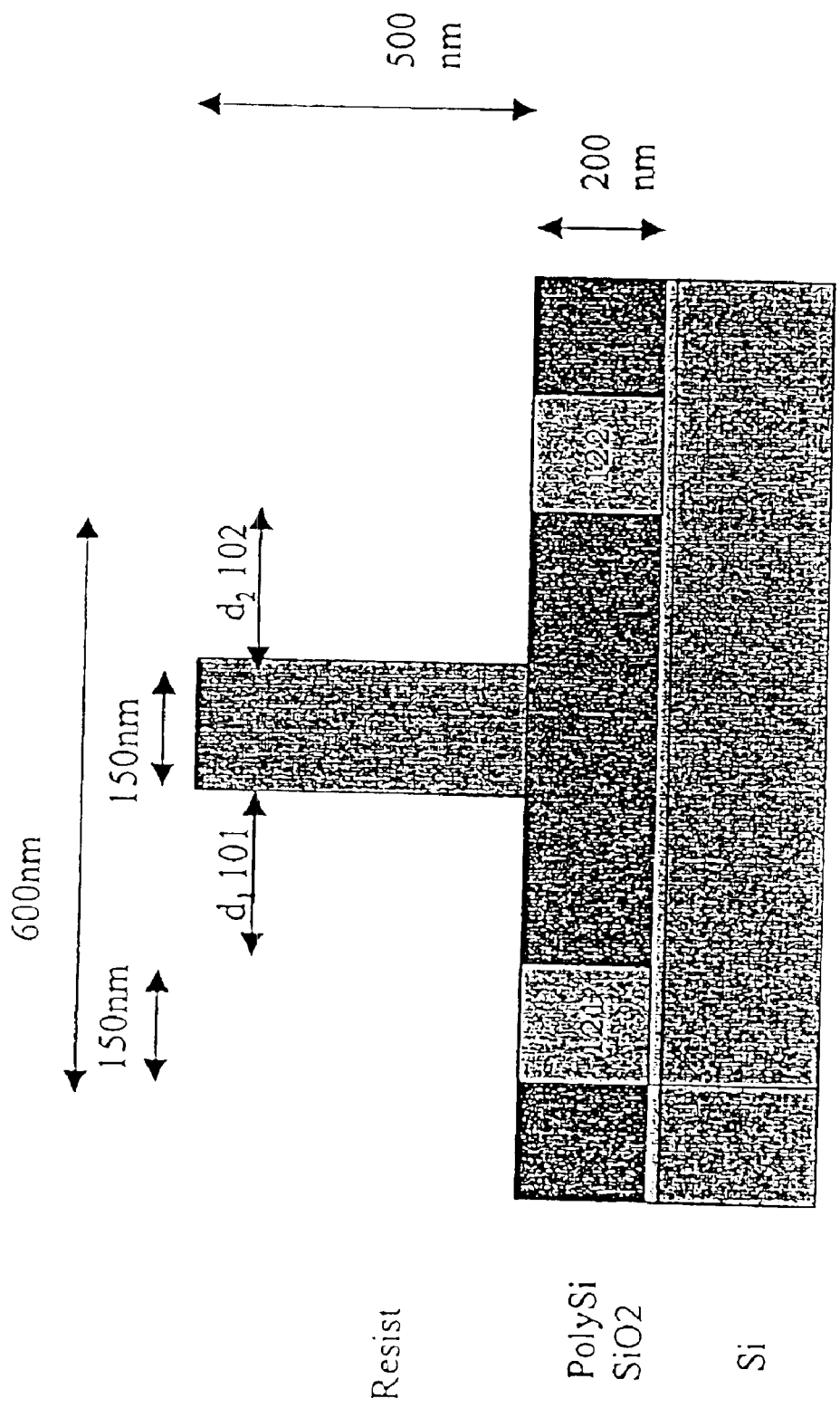
FIG. 12 is a process diagram illustrating a second example of a line-on-line structure in accordance with the present invention.
Figure 13B:
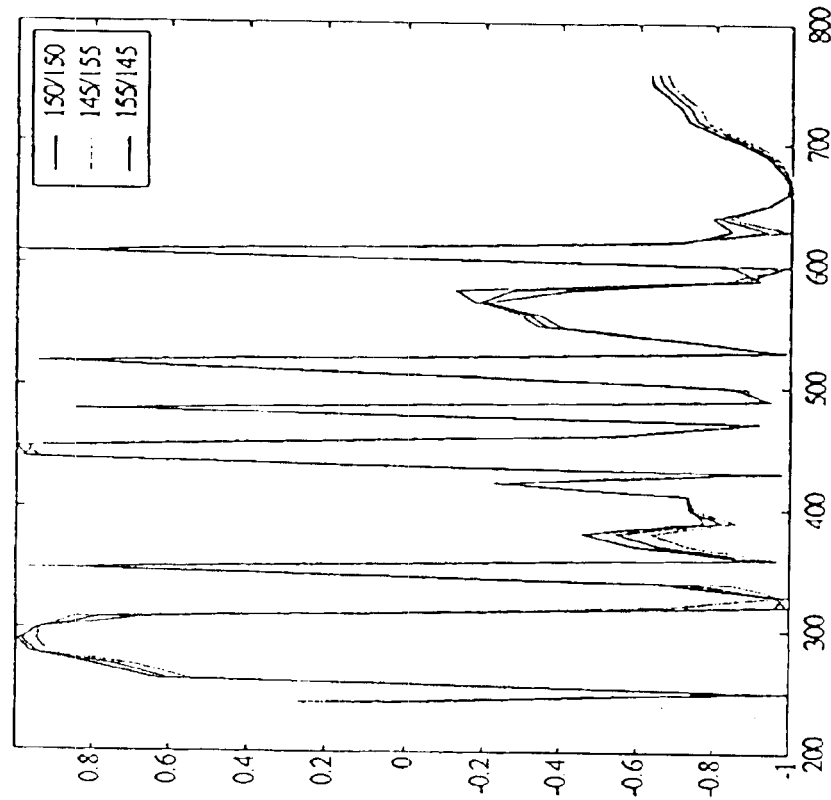
FIGS. 13A–13B are graphical diagrams illustrating the overlay measurements of the line-on-line structure in FIG. 12 using an ellipsometer in accordance with the present invention.
Figure 13A:
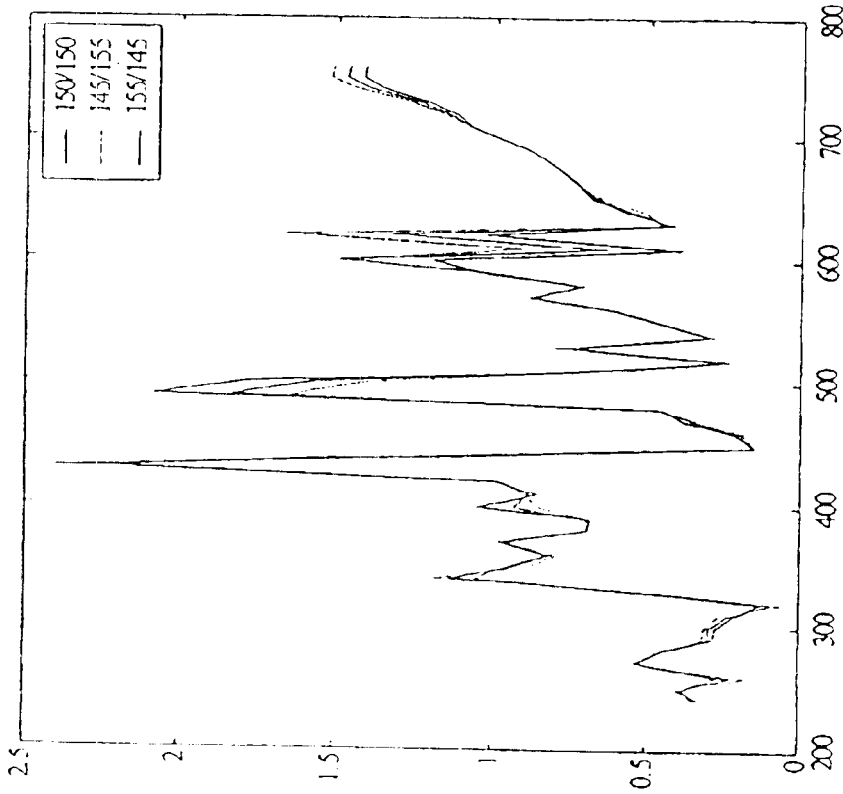

FIG. 12 is a process diagram illustrating a second example of a line-on-line structure 120, with dielectric layers 121 and 122. FIGS. 13A–13B are graphical diagrams illustrating the overlay measurements of the line-on-line structure in FIG. 12 using an ellipsometer in accordance with the present invention.

The line-in-line and line-on-line overlay measurements can be applied to single wavelength variable incident angle optical metrology equipment. Additionally, the line-in-line and line-on-line overlay measurements can be applied to any combination of single wavelength variable incident angle optical metrology equipment and multiple wavelength fixed incident angle optical metrology equipment. Furthermore, the line-in-line and line-on-line overlay measurements can be applied to multiple wavelength multiple incident angle optical metrology equipment.

The above embodiments are only illustrative of the principles of this invention and are not intended to limit the invention to the particular embodiments described. Accordingly, various modifications, adaptations, and combinations of various features of the described embodiments can be practiced without departing from the scope of the invention as set forth in the appended claims.

We claim:

1. A method of obtaining overlay measurements, the method comprising:

forming a first grating test pattern using a first layer mask;

forming a second grating test pattern using a second layer mask, wherein the first and second grating test patterns have the same periodicity;

measuring the first and second grating test patterns using an optical metrology equipment; and measuring the alignment of the second layer mask to the first layer mask based on the measurement of the first and second grating test patterns.

2. The method of claim 1, wherein grating lines of the second grating test pattern are formed on top of grating lines of the first grating test pattern.

3. The method of claim 2, wherein a first distance measures a gap from a left edge of a first grating line of the first grating test pattern to a left edge of a first grating line of the second grating test pattern, wherein the first grating line of the second grating test pattern is formed on top of the first grating line of the first grating test pattern.

4. The method of claim 3, wherein a second distance measures a gap from the right edge of the first grating line of the first grating test pattern to the right edge of the first grating line of the second grating test pattern.

5. The method of claim 2, further comprising:

forming one or more material layers between the first grating test pattern and the second grating test pattern.

6. The method of claim 1, wherein grating lines of the second grating test pattern are interlaced with grating lines of the first grating test pattern.

7. The method of claim 6, wherein a first distance measures a gap from a right edge of a first grating line of the first grating test pattern to a left edge of a first grating line of the second grating test pattern, wherein the first grating line of the second grating test pattern is formed adjacent to the first grating line of the first grating test pattern.

8. The method of claim 7, wherein a second distance measures a gap from a right edge of the first grating line of the second grating test pattern to a left edge of a second grating line of the first grating test pattern, wherein the first grating line of the second grating test pattern is formed between the first and second grating lines of the first grating test pattern.

9. The method of claim 6, further comprising:

forming one or more material layers between the first grating test pattern and the second grating test pattern.

10. The method of claim 1, wherein the first and second grating test patterns include:

a first grating having grating lines in a first orientation; and a second grating having grating lines in a second orientation perpendicular to the first orientation, wherein the second grating is adjacent to the first grating.

11. The method of claim 10, wherein the first and second grating test patterns include:

a third grating having grating lines in a third orientation, wherein the third orientation is 45 degrees relative to the first orientation; and a fourth grating having grating lines in a fourth orientation perpendicular to the third orientation, wherein the fourth grating is adjacent to the third grating and the second grating.

12. The method of claim 11, wherein the first, second, third, and fourth gratings are quadrants in a four-quadrant test pattern formed on a semiconductor wafer.

13. The method of claim 12, wherein measuring the first and second grating test patterns comprises:

measuring the first, second, third, and fourth gratings without rotating or reloading the semiconductor wafer.

14. The method of claim 13, wherein measuring the alignment of the second layer mask to the first layer mask comprises:

measuring the alignment in the first, second, third, and fourth orientations based on the measurement of the first, second, third, and fourth gratings.

15. The method of claim 1, wherein the optical metrology equipment is a spectroscopic reflectometer or a spectroscopic ellipsometer.

16. A method of obtaining overlay measurements, the method comprising:

forming a first grating test pattern using a first layer mask;

forming a second grating test pattern using a second layer mask, wherein the first and second grating test patterns have the same periodicity, and wherein the first and second grating test patterns have:

a first grating having grating lines in a first orientation, and a second grating having grating lines in a second orientation perpendicular to the first orientation;

measuring the first and second grating patterns including the first and second gratings using an optical metrology equipment; and measuring the alignment of the second layer mask to the first layer mask in the first and second orientations based on the measurement of the first and second grating patterns including the first and second gratings.

17. The method of claim 16, wherein a first distance measures a gap from a left edge of a first grating line of the first grating test pattern to a left edge of a first grating line of the second grating test pattern, wherein the first grating line of the first grating test pattern is formed on top of the first grating line of the second grating test pattern, and wherein a second distance measures a gap from the right edge of the first grating line of the first grating test pattern to the right edge of the first grating line of the second grating test pattern.

18. The method of claim 16, wherein a first distance measures a gap from a right edge of a first grating line of the first grating test pattern to a left edge of a first grating line of the second grating test pattern, wherein the first grating line of the second grating test pattern is formed adjacent to the first grating line of the first grating test pattern, wherein a second distance measures a gap from a right edge of the first grating line of the second grating test pattern to a left edge of a second grating line of the first grating test pattern, and wherein the first grating line of the second grating test pattern is formed between the first and second grating lines of the first grating test pattern.

19. The method of claim 16, wherein the first and second gratings are formed on a semiconductor wafer, and wherein the first and second gratings are measured using the optical metrology equipment without reloading the semiconductor wafer.

20. The method of claim 16, wherein the first and second grating test patterns include:

a third grating having grating lines in a third orientation, wherein the third orientation is 45 degrees relative to the first orientation; and a fourth grating having grating lines in a fourth orientation perpendicular to the third orientation.

21. A structure formed on a semiconductor wafer for obtaining overlay measurements, the structure comprising:

a first grating test pattern formed on the semiconductor wafer using a first layer mask; and a second grating test pattern formed on the semiconductor wafer using a second layer mask, wherein the first and second grating test patterns have the same periodicity, wherein the first and second grating test patterns are measured using an optical metrology equipment, and wherein the alignment of the second layer mask to the first layer mask is measured based on the measurement of the first and second grating test patterns.

22. The structure of claim 21, wherein grating lines of the second grating test pattern are formed on top of grating lines of the first grating test pattern.

23. The structure of claim 22, further comprising:

a first gap from a left edge of a first grating line of the first grating test pattern to a left edge of a first grating line of the second grating test pattern, wherein the first grating line of the second grating test pattern is formed on top of the first grating line of the first grating test pattern; and a second gap from the right edge of the first grating line of the first grating test pattern to the right edge of the first grating line of the second grating test pattern.

24. The structure of claim 22, further comprising:

one or more material layers formed between the first grating test pattern and the second grating test pattern.

25. The structure of claim 21, wherein grating lines of the second grating test pattern are interlaced with grating lines of the first grating test pattern.

26. The structure of claim 25, further comprising:

a first gap from a right edge of a first grating line of the first grating test pattern to a left edge of a first grating line of the second grating test pattern, wherein the first grating line of the second grating test pattern is formed adjacent to the first grating line of the first grating test pattern; and a second gap from a right edge of the first grating line of the second grating test pattern to a left edge of a second grating line of the first grating test pattern, wherein the first grating line of the second grating test pattern is formed between the first and second grating lines of the first grating test pattern.

27. The structure of claim 25, further comprising:

one or more material layers formed between the first grating test pattern and the second grating test pattern.

28. The structure of claim 21, wherein the first and second grating test patterns include:

a first grating having grating lines in a first orientation; and a second grating having grating lines in a second orientation perpendicular to the first orientation, wherein the second grating is adjacent to the first grating.

29. The structure of claim 28, wherein the first and second grating test patterns include:

a third grating having grating lines in a third orientation, wherein the third orientation is 45 degrees relative to the first orientation; and a fourth grating having grating lines in a fourth orientation perpendicular to the third orientation, wherein the fourth grating is adjacent to the third grating and the second grating.

30. The structure of claim 29, wherein the first, second, third, and fourth gratings are quadrants in a four-quadrant test pattern formed on the semiconductor wafer.

31. The structure of claim 21, wherein the optical metrology equipment is a spectroscopic reflectometer or a spectroscopic ellipsometer.

* * * * *